United States Patent
Haas

[19]

[11] Patent Number: 6,040,895
[45] Date of Patent: Mar. 21, 2000

[54] METHOD AND DEVICE FOR CONTROLLED ILLUMINATION OF AN OBJECT FOR IMPROVING IDENTIFICATION OF AN OBJECT FEATURE IN AN IMAGE OF THE OBJECT

[75] Inventor: Gerhard Haas, Oberschleissheim, Germany

[73] Assignee: Siemens Aktiengesellschaft, Munich, Germany

[21] Appl. No.: 09/069,283

[22] Filed: Apr. 29, 1998

[30] Foreign Application Priority Data

Oct. 8, 1997 [DE] Germany .................. 197 44 454

[51] Int. Cl.[7] .................. G03B 27/54; G01B 11/00; H04N 7/18
[52] U.S. Cl. .................. 355/70; 356/399; 348/131
[58] Field of Search .................. 355/67, 70, 77, 355/53, 18, 71; 356/399, 400, 3, 11, 800; 362/16, 17, 18; 250/559.46, 548; 358/240, 107, 125, 212, 241, 100; 348/131, 132, 87, 92, 93, 126, 128

[56] References Cited

U.S. PATENT DOCUMENTS

| | | | |
|---|---|---|---|
| 5,010,412 | 4/1991 | Garriss | 358/240 |
| 5,365,341 | 11/1994 | Sugawara | 356/394 |
| 5,369,492 | 11/1994 | Suguwara | 356/394 |
| 5,394,246 | 2/1995 | Sugawara | 356/394 |
| 5,396,334 | 3/1995 | Sugawara | 356/394 |
| 5,455,870 | 10/1995 | Sepai et al. | |
| 5,469,294 | 11/1995 | Wilt et al. | |
| 5,621,218 | 4/1997 | Tanaka | 250/559.34 |
| 5,943,125 | 8/1999 | King et al. | 356/237.1 |

FOREIGN PATENT DOCUMENTS

| | | | |
|---|---|---|---|
| 5332939 | 12/1993 | Japan | G01B 11/00 |
| 8219716 | 8/1996 | Japan | G01N 21/84 |
| WO 96/21343 | 7/1996 | WIPO | H05K 13/08 |

*Primary Examiner*—Safet Metjahic
*Assistant Examiner*—Khaled Brown
*Attorney, Agent, or Firm*—Hill & Simpson

[57] ABSTRACT

In a method and apparatus wherein components and/or markings applied to substrates are illuminated with illumination devices and imaged via a camera, adequate contrast between useful and unwanted structures is achieved even in the case of highly disparate optical properties of different materials for the substrates, components and markings by the use of an illumination device composed of a number of illumination units that respectively emit light in spectral ranges different from one another and which are thereby separately varied in intensity. This illumination with variable spectral distribution assures an adequate contrast even given the employment of different materials for the illuminated items.

10 Claims, 2 Drawing Sheets

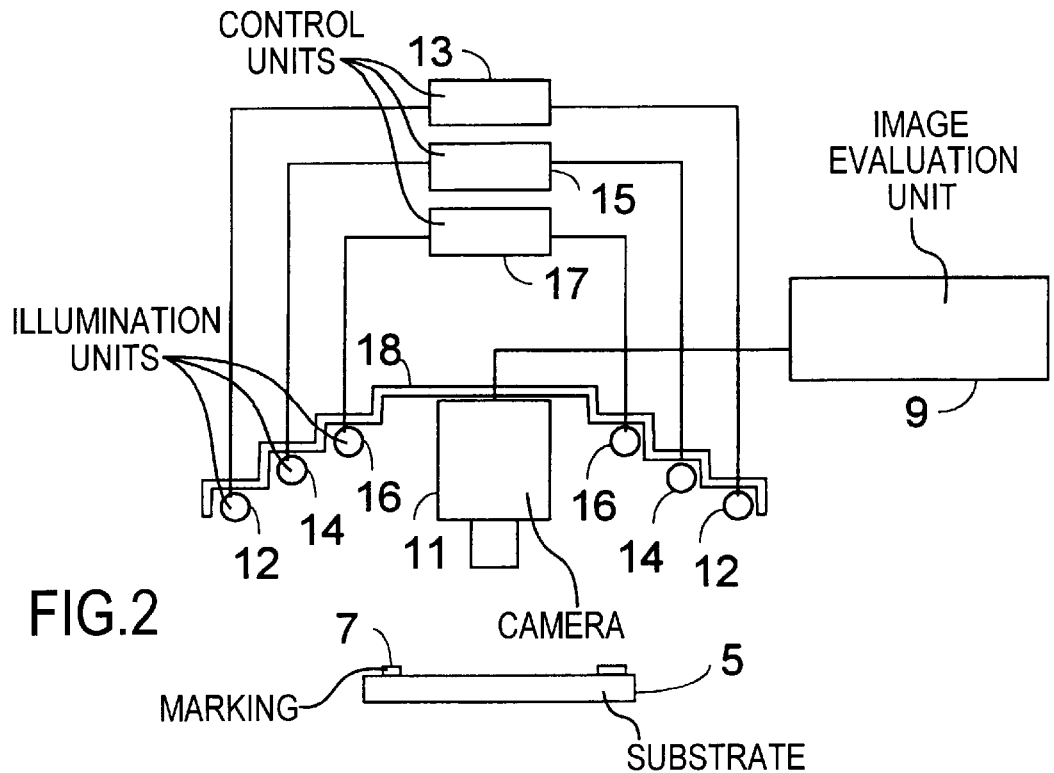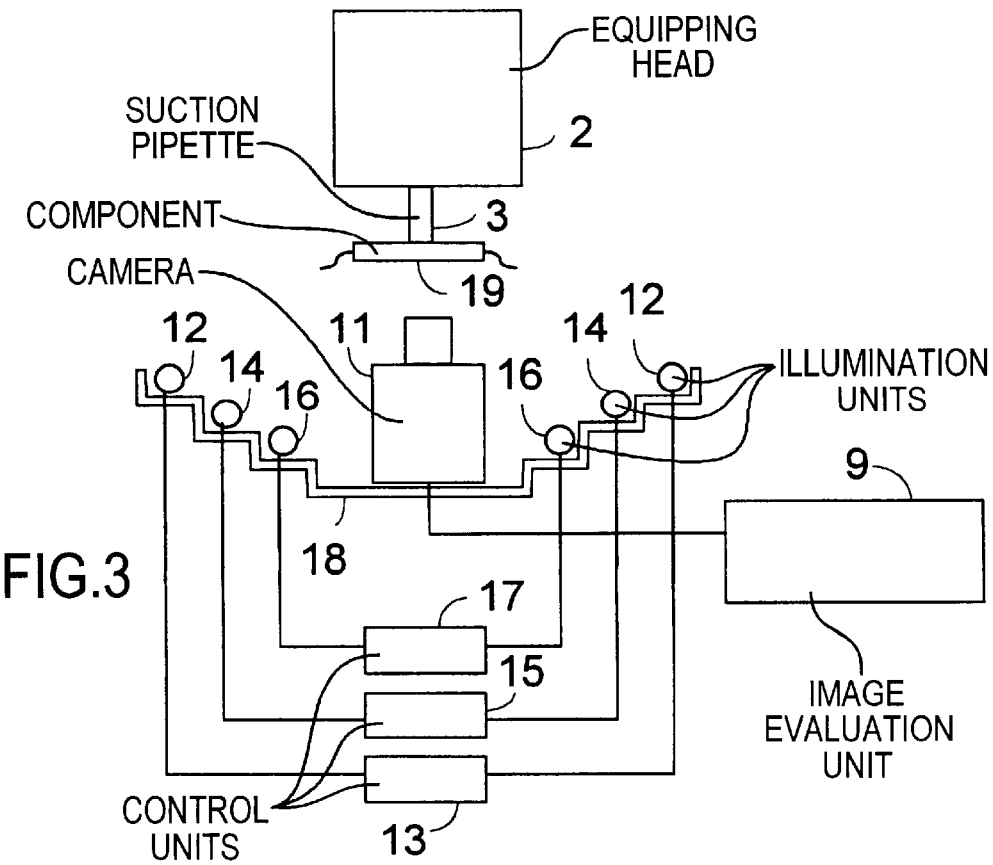

METHOD AND DEVICE FOR CONTROLLED ILLUMINATION OF AN OBJECT FOR IMPROVING IDENTIFICATION OF AN OBJECT FEATURE IN AN IMAGE OF THE OBJECT

BACKGROUND OF THE INVENTION

1. Field of the Invention

The present invention is directed to a method and device for controlling or setting the illumination of an object for improving identification of an object feature in an image of the object, such as for recognizing a position of an electrical component or a substrate onto which the component is to be mounted at a designated position, or for quality control of components or substrates having a quality control marking thereon.

2. Description of the Prior Art

In the automatic equipping of printed circuit boards or ceramic substrates with components, particularly SMD (surface mounted device) components, the position of the components relative to the placement position on the printed circuit board is determined with means for position recognition before the placement. As used herein, the term "components" means all equippable articles including, for example shielding plates as well. Vision systems that employ a camera, for example a CCD camera, and an illumination means are generally employed as position recognition devices. A visual inspection of components ensues in analogously constructed apparatus for quality control in order to recognize faulty components and to remove them from the equipping process.

Centering marks applied on the substrates serve for the positional recognition of the substrates. Reject marks applied on the substrates are used for marking faulty substrates, so that these faulty substrates can be identified in the means for quality control and subsequently removed from the equipping process. A large variety of substrates (epoxy/fiberglass composites, plastic films, ceramics, resin-bonded paper) is employed. Different materials such as glossy or matte metals/metal oxides or plastic or lacquer coverings are also used for the markings. The optical surface properties of these various materials for substrates and markings vary extensively and thus so does the contrast between the marking and the substrate produced by an illumination. The illumination therefore should be selected such that useful structures (generally, the terminals of the components or the markings) are displayed with very high contrast relative to unwanted structures (for example, the body of the components or the substrate background).

To this end, methods are known wherein the components are illuminated from different angles with different intensities with the assistance of illumination devices that are subdivided into a number of lighting units with respectively separately controllable intensity control. The illumination devices thereby have a nearly constant spectral distribution.

For example, PCT Application WO 96/21343 discloses a method wherein, using a segmented ring lamp, the components are not uniformly illuminated from all angles; rather, no light is incident onto the structure from specific angles. Images of unwanted structures that emerge especially pronounced at these specific angles are thus suppressed.

Markings and substrates and/or components are respectively manufactured of materials that have optical properties such as absorption, metallic or diffuse reflection differing from one another in order to distinguish them from one another on the basis of their respectively different backscatter behavior upon illumination with an illumination means having nearly constant spectral distribution. The optical properties vary with the wavelength of the illuminating light, and thus certain material combinations for markings, substrates and/or components cannot be distinguished from one another in the illumination with nearly constant spectral distribution. A replacement of the illumination means dependent on the materials employed is very complicated and cannot be implemented due to the time losses associated therewith, which would prevent high equipping throughput.

SUMMARY OF THE INVENTION

It is an object of the present invention to provide a method and an apparatus for setting illumination that assure a reliable recognition given different materials employed for substrates, markings and/or components.

The above object is achieved in accordance with the principles of the present invention in a method and device wherein an object is illuminated by light from a plurality of illumination sources, the light from each source having a spectral distribution which is individually variable, and the illumination sources being respectively connected to intensity control devices which respectively adjust the spectral distribution of the light respectively emitted by the sources until an optimized illumination of the object is achieved. When this optimized illumination is achieved, a feature of the object can be reliably recognized in an evaluation of an image of the object, the image of the object being obtained with a camera.

The feature which is optimally illuminated may be an edge, a terminal, or some other structural part of an electrical component or a substrate onto which the electrical component is to be mounted at a predetermined position. The object feature may alternatively be a quality control marking, such as a marking indicating an electrical component or a substrate is defective and therefore should not be used, in the context of a quality control check made in an automatic processing device, such as a component equipping device.

Compared to known methods, the inventive method exhibits the advantage that the spectral distribution of the illumination is varied by variation of the parameters of the intensity control circuit. Since reflection or backscatter behavior of the materials for components, markings and substrates are wavelength-dependent, a color-optimized illumination is achieved that enables an improved contrast between unwanted and useful structures for components, substrates and/or markings made of different materials.

In an embodiment of the method that is especially simple to realize, the illumination units respectively emit light in a narrowband spectral range, with different illumination units emitting light in different spectral ranges. The intensities of the individual illumination units are varied by the intensity control circuits respectively allocated to the illumination units, so that illuminations with a different spectral intensity color distribution are set.

In a further embodiment, illumination units whose emission wavelength is variable are employed. In this case, the emission wavelength is likewise varied with the intensity control circuit. As a result, fewer illumination units are employed and a more compact structure is achieved.

In another embodiment of the method, given a group of identical components and/or markings, the optimized illumination setting for a first component and/or a first marking is first determined. The parameters derived therefrom for the intensity setting are stored and can be employed for the illumination of the further components and/or markings. Equally good recognition of identical components and/or markings is thus assured.

The optimized illumination can be automatically determined, leading to a better reproducibility in the illumination setting.

The intensity of a group of illumination units that respectively emit light in a common spectral range can be varied in common. The number of intensity control devices which must be individually driven is thus reduced, as is the time in order to determine an optimized illumination.

In an apparatus for the implementation of the method, at least two illumination units emit light in a respectively different spectral ranges.

A more compact device can be constructed using variable wavelength illumination units, thereby reducing the number of illumination units.

A common intensity control device can be provided for a group of illumination units in order, as already described, to reduce the complexity of the optimum illumination setting.

The illumination units can be rigidly connected to the camera, allowing the illumination units and the camera to be simultaneously moved across the substrate or the component, thereby achieving a time reduction compared to separate motions.

The illumination units can be arranged such that they emit light in different directions. As a result, the advantage of higher contrast given illumination from different directions is combined with the advantage of higher contrast due to the illumination with different colors.

Light-emitting diodes can be utilized as light sources since these can be particularly economically obtained and are available for emitting light of different colors.

DESCRIPTION OF THE DRAWINGS

FIG. 2 is a schematic illustration of an illumination device for the illumination of substrates with markings constructed and operating in accordance with the invention FIG. 3 is a schematic illustration of an illumination device for illuminating component constructed and operating in accordance with the invention.

DESCRIPTION OF THE PREFERRED EMBODIMENTS

Figure 1:
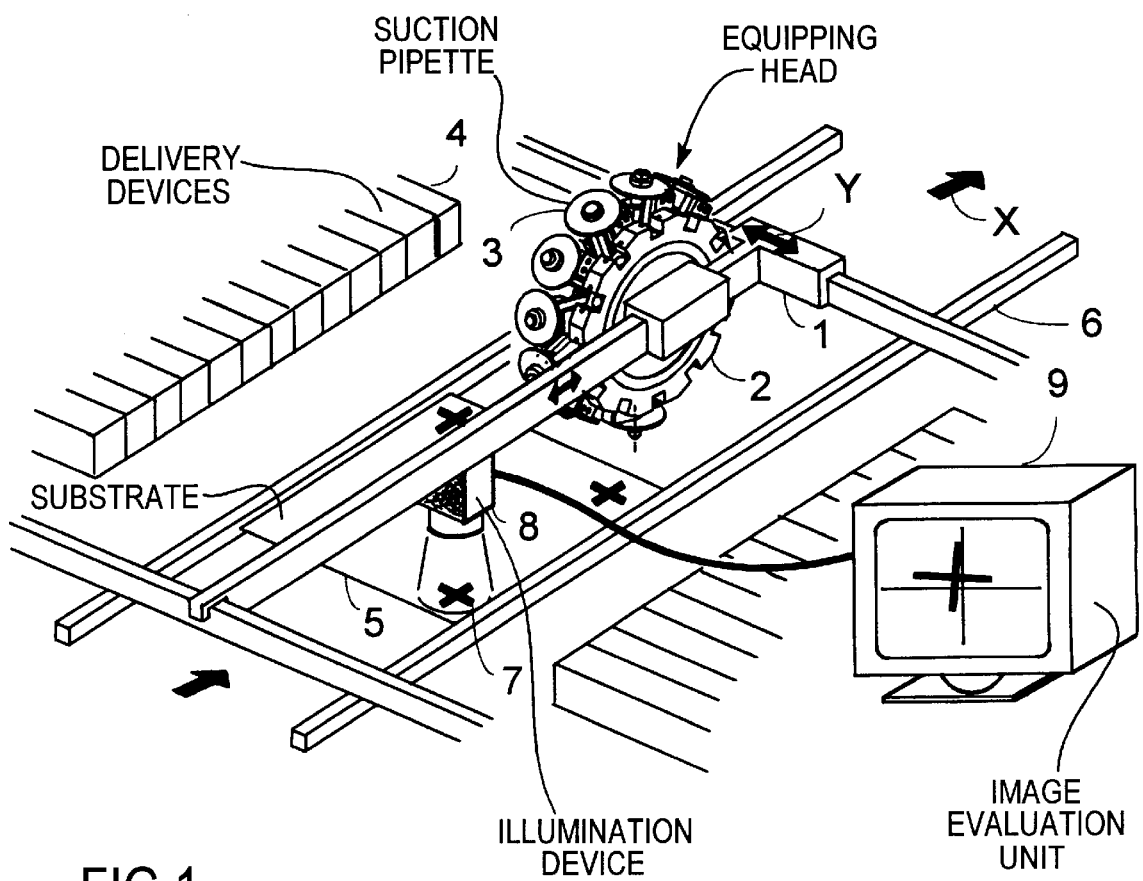
FIG. 1 is a schematic illustration of an automatic equipping unit for equipping components on substrates.

FIG. 1 shows how an equipping head 2 located at a portal 1 in an automatic equipping unit can be moved in the X-direction and the Y-direction with the assistance of motors (not shown). The equipping head Z carries suction pipettes 3, twelve of them in this case, with which components (not shown) from delivery devices 4 are picked up and deposited on substrates 5 at a previously determined position. Printed circuit boards as well as ceramic substrates are included within the term "substrate". The substrates 5 are thereby conveyed in the X-direction by a substrate moving unit 6. Markings 7 that are imaged by an illumination device 8 and stored in an image evaluation unit 9, are applied on the substrate 5 for correcting the position of the components relative to the substrate 5. In this example, a monitor for visual observation is provided as the image evaluation unit 9. In addition to centering marks 7 for positional recognition of the substrate 5, reject markings that were applied to substrates 5 unsuitable for the further equipping process are also detected in this way. These unsuitable substrates 5 are recognized in this way and subsequently removed from the equipping process.

In the inventive method, a device as shown in FIG. 2 is employed, for example, as the illumination device 8. A camera 11, for example a CCD camera, thus registers the image of the substrate 5 with the markings 7 and stores the image in a following image evaluation unit 9. The substrate 5 with the markings 7 is illuminated by sets of illumination units 12, 14, 16. The set of illumination units 12 emit light in a narrow spectral range around a first wavelength whose intensity is varied by a common intensity control unit 13. The set of illumination units 14 emit light in a second narrowband spectral range around a second wavelength and are varied in intensity by a common intensity control unit 15. The set of illumination units 16 emit in a third narrowband spectral range around a third wavelength and are varied in intensity by a third intensity control unit 17. The sets of illumination units 12, 14, 16 are rigidly connected to the camera 11 by a holder 18, so that they can be moved across the substrate 5 simultaneously with the camera 11. The sets of illumination units 12, 14, 16 are each fashioned, for example, as respective ring-shaped light sources. For an optimized illumination, the individual sets of illumination units 12, 14, 16 are varied in intensity by varying the parameters at the allocated intensity control units 13, 15, 17 until an optimized illumination with optimum contrast is registered by the camera 11 and stored in the image evaluation unit 9. Given the use of variable-wavelength sets of illumination units 12, 14, 16 such as, for example, variable-wavelength light-emitting diodes, the emitted spectral range is varied by the intensity control units 13, 15, 17.

When a number of identical substrates 5 with identical markings 7 are illuminated during the equipping process and their images registered, then the optimized illumination setting is initially determined at only one marking 7 in a calibration phase, and the corresponding parameters are stored and the further, identical markings 7 are illuminated with the optimum illumination allocated to these parameters. This procedure can be automated in that, for example, the unwanted and the useful structures of the markings 7 and of the substrates 5 are stored as geometrical structures at the beginning of the equipping process, and the intensities of the different sets of illumination units 12, 14, 16 are varied during the calibration phase, the corresponding images are stored, the contrasts achieved therefrom are stored, and the optimized contrast, and thus the optimized intensity settings, are determined therefrom. It is shown in FIG. 2 that the different sets of illumination units 12, 14, 16 illuminate the substrate 5 and, thus, the markings 7 from different directions. Light-emitting diodes are especially suitable for forming the sets of illumination units 12, 14, 16 since they are inexpensive and their intensity can be regulated in a simple way. Light-emitting diodes that respectively emit in different spectral colors can be obtained. Moreover, light-emitting diodes can be easily arranged in a matrix, so that a large-area illumination device 8 can be achieved.

FIG. 3 shows that the inventive apparatus is also suitable for the illumination of components 19 at the suction pipette 3 of an equipping head 2 in order to identify the position of the component. In general, the terminals of the component 19 form the useful structures and the body of the component 19 forms the unwanted structures. Analogous to the above-described method given markings 7 and substrates 5, the optimum illumination for a first component is determined in a calibration phase and is subsequently employed for further, identical components 19.

The inventive apparatus therefore has the advantage of assuring respectively optimized illumination for components 19, substrates 5 and/or markings 7 composed of the most disparate materials.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for optimally illuminating a group of objects an object having substantially identical object features, comprising the steps of:

placing a first object in a group of objects in a field of view of a camera and obtaining an image of said object, said first object having an object feature and said object feature being present in said image;

while said first object is in the field of view of said camera, illuminating said first object with illuminating light formed by emitted light from a plurality of illumination sources, the emitted light from each illumination source having a spectral distribution;

providing a control device for each of said illumination sources and controlling said illumination sources by varying parameters of said control devices to vary the spectral distribution of the emitted light from each of said illumination sources until an optimized illumination of said first object by said illuminating light is achieved at which said object feature is reliably recognizable in said image;

storing said parameters which produce an optimized illumination of said first object as stored parameters; and setting said control devices with said stored parameters for illuminating all other objects in said group.

2. A method as claimed in claim 1 wherein each of said illumination sources has a wavelength allocated thereto and wherein the step of illuminating said object comprises, for each illumination source in said plurality of illumination sources, emitting said emitted light in a narrowband spectral range around a wavelength allocated to the illumination source, with the wavelengths respectively allocated to at least two of said illumination sources being different from each other, and wherein the step of controlling said illumination sources comprises separately and individually varying the parameters of the control devices respectively provided for said illumination sources.

3. A method as claimed in claim 2 wherein the step of varying parameters comprises varying parameters of said control devices for varying the respective wavelengths allocated to the illumination sources.

4. A method as claimed in claim 1 wherein said object feature comprises a geometrical structure of an object, said geometrical structure including unwanted structures and useful structures, and said method comprising the step of determining said optimized illumination of said first object by the steps of:

illuminating said first object of said group and varying parameters of said control devices until an optimum contrast between the unwanted structures and the useful structures of said first object is obtained;

storing the parameters of said control devices which produced said optimum contrast for said first object as said stored parameters; and employing the stored parameters which produced said optimum contrast for setting said control devices for illumination of all other objects in said group.

5. A method as claimed in claim 1 wherein each of said illumination sources produces the emitted light therefrom in a narrowband range around a wavelength allocated to the illumination source, with at least two of said illumination sources having the same wavelength allocated thereto, and wherein the step of varying parameters of said control devices comprises commonly varying parameters of the control devices provided for the at least two illumination sources to which the same wavelength is allocated.

6. An apparatus for optimally illuminating a group of objects having substantially identical object features, comprising:

a camera having a field of view;

means for placing a first object of a group of objects in said field of view of said camera, said camera obtaining an image of said first object, said first object having an object feature and said object feature being present in said image;

means for illuminating said first object while said first object is in the field of view of said camera, with illuminating light formed by emitted light from a plurality of illumination sources, the emitted light from each illumination source having a spectral distribution;

a plurality of control devices respectively connected to said illumination sources and controlling said illumination sources by varying parameters of said control devices to vary the spectral distribution of the emitted light from each of said illumination sources until an optimized illumination of said first object by said illuminating light is achieved at which said object feature is reliably recognizable in said image;

means for storing said parameters which produce an optimized illumination of said first object as stored parameters; and means for setting said control devices with said stored parameters for illuminating all other objects in said group.

7. An apparatus as claimed in claim 6 wherein each of said illumination sources has a wavelength allocated thereto, each said illumination source in said plurality of illumination sources emitting said emitted light in a narrowband spectral range around the wavelength allocated to the illumination source, with the wavelengths respectively allocated to at least two of said illumination sources being different from each other, and wherein said control devices separately and individually vary the parameters of the respective control devices.

8. An apparatus as claimed in claim 6 wherein said control devices vary the respective wavelengths allocated to the illumination sources.

9. An apparatus as claimed in claim 6 wherein said object feature comprises a geometrical structure of an object, said geometrical structure including unwanted structures and useful structures, and wherein said means for illuminating comprises means for illuminating said first object of said group while varying parameters of said control devices until an optimum contrast between the unwanted structures and the useful structures of said first object is obtained, said apparatus further comprising:

means for storing the parameters of said control devices which produced said optimum contrast for said first object as said stored parameters; and means for employing the stored parameters which produced said optimum contrast for setting said control devices for illumination of all other objects in said group.

10. An apparatus as claimed in claim 6 wherein each of said illumination sources produces the emitted light therefrom in a narrowband range around a wavelength allocated to the illumination source, with at least two of said illumination sources having the same wavelength allocated thereto, and wherein said apparatus further comprises means for commonly varying parameters of the control devices provided for the at least two illumination sources to which the same wavelength is allocated.

* * * * *